United States Patent [19]

Temple

[11] Patent Number: 5,757,036
[45] Date of Patent: *May 26, 1998

[54] SEMICONDUCTOR DEVICE WITH IMPROVED TURN-OFF CAPABILITY

[75] Inventor: Victor Albert Keith Temple, Clifton Park, N.Y.

[73] Assignee: Harris Corporation, Melbourne, Fla.

[*] Notice: The term of this patent shall not extend beyond the expiration date of Pat. No. 5,350,935.

[21] Appl. No.: 275,564

[22] Filed: Jul. 15, 1994

Related U.S. Application Data

[63] Continuation of Ser. No. 847,789, Mar. 6, 1992, Pat. No. 5,350,935, which is a continuation-in-part of Ser. No. 663,780, Mar. 4, 1991, Pat. No. 5,111,268, which is a continuation of Ser. No. 707,309, Mar. 1, 1985, abandoned, which is a continuation of Ser. No. 391,620, Jun. 24, 1982, abandoned, which is a continuation-in-part of Ser. No. 331,049, Dec. 16, 1981, abandoned.

[51] Int. Cl.[6] .......................... H01L 29/74; H01L 31/111
[52] U.S. Cl. .................................. 257/147; 257/152
[58] Field of Search ............................... 257/138, 147, 257/152

[56] References Cited

U.S. PATENT DOCUMENTS 5,350,935  9/1994  Temple ........................... 257/138

*Primary Examiner*—Wael Fahmy
*Attorney, Agent, or Firm*—Frederick R. Jorgensor; Ferdinand M. Romano

[57] ABSTRACT

A four-region semiconductor device (that is, a p-n-p-n or n-p-n-p device) including at least one further region utilizes integral FET structure for diverting carriers away from an interior region of the device and shunting them to a main current-carrying electrode of the device, whereby the device is provided with a turn-off capability. The device requires only a small amount of energy for its turn-off control gate, and utilizes a high percentage of its semiconductor body for carrying current through the device. High speed turn-off is achieved in a particular embodiment of the device.

1 Claim, 5 Drawing Sheets

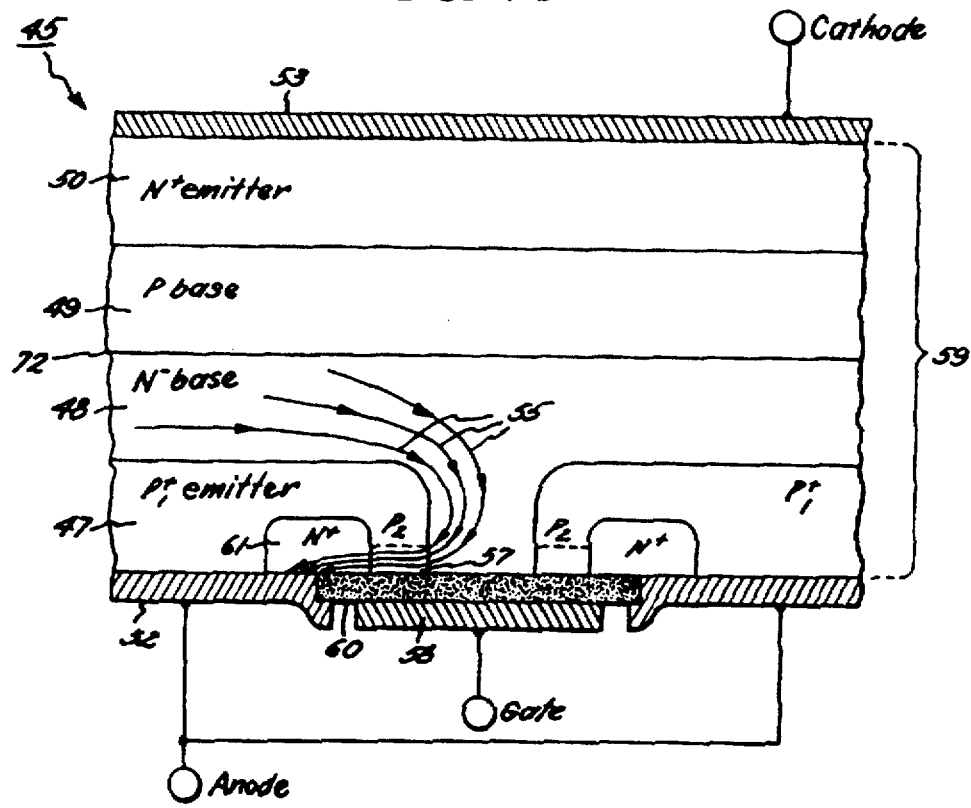
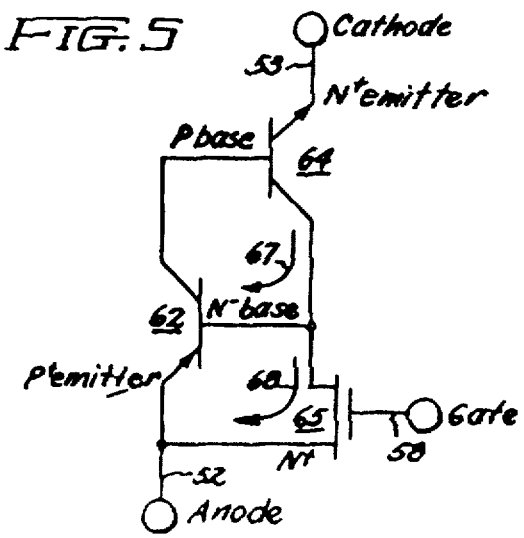

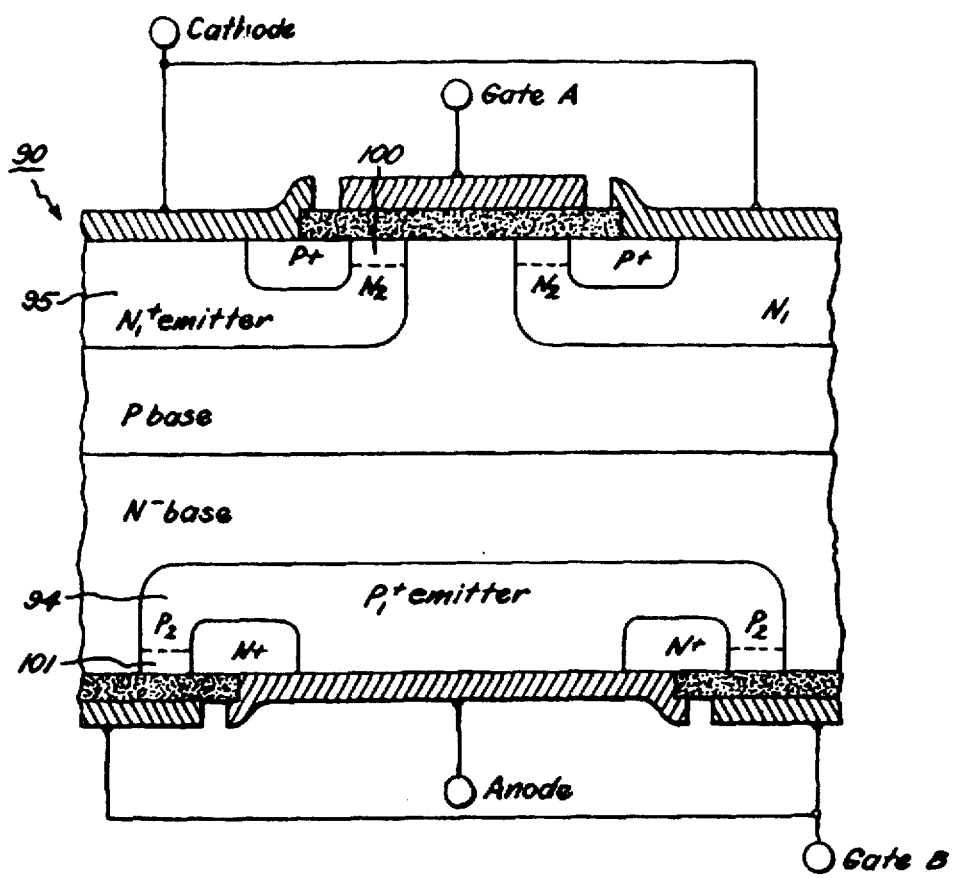
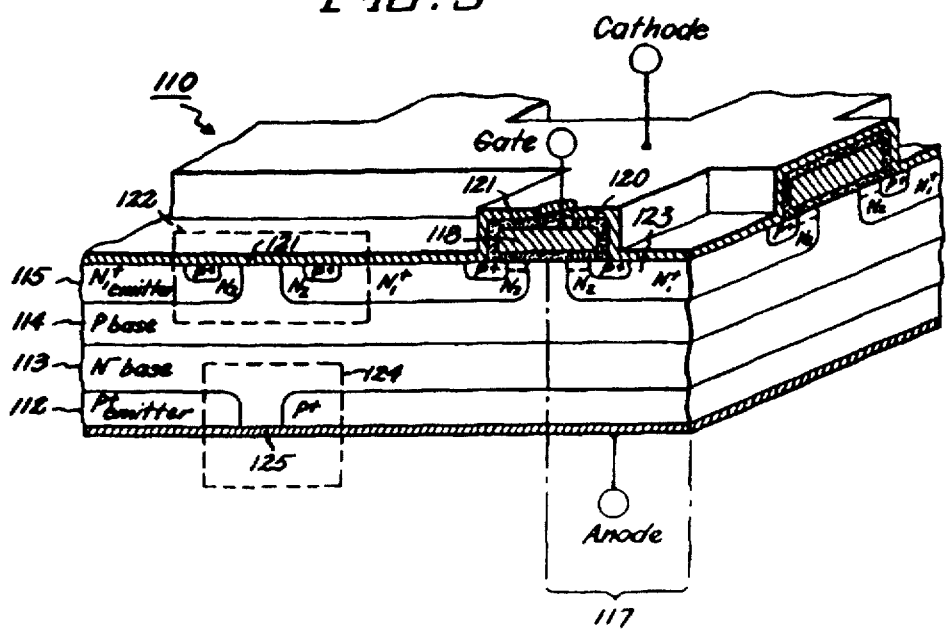

SEMICONDUCTOR DEVICE WITH IMPROVED TURN-OFF CAPABILITY

CROSS-REFERENCE TO RELATED APPLICATION

This is a continuation of U.S. patent application Ser. No. 07/847,789 filed Mar. 6, 1992, now U.S. Pat. No. 5,350,935, which is a continuation-in-part of U.S. Pat. application Ser. No. 07/663,780, filed Mar. 4, 1991, now U.S. Pat. No. 5,111,268, filed Mar. 4, 1991, which is a continuation of U.S. application Ser. No. 06/707,309 filed Mar. 1, 1985, now abandoned, which is a continuation of U.S. application Ser. No. 06/391,620, filed Jun. 24, 1982, now abandoned, which is a continuation-in-part of U.S. application Ser. No. 06/331,049, filed Dec. 16, 1981, now abandoned.

BACKGROUND OF THE INVENTION

The present invention relates to a four-region semiconductor device (that is, a p-n-p-n or n-p-n-p device) including at least one further region, and, more particularly, to a four-region device having the capability of turning off upon application of a voltage signal to a control gate thereof.

Four-region semiconductor devices per se are well known in the art, and include, for example, thyristors or SCRs. Many techniques exist for turning on a thyristor; however, fewer techniques exist for turning off a thyristor. One technique for turning off a thyristor is implemented in a gate turn-off thyristor (GTO). A GTO is a four-region device which has a control gate connected to one of the inner regions thereof, for example, the P-base region. With the connection made to the P-base region, a positive bias voltage of sufficient magnitude, applied to the GTO's control gate, serves to turn the GTO on. A negative bias voltage of sufficient magnitude applied to the GTO's control gate serves to turn off the GTO.

As will be appreciated by those skilled in the art, a turn-off current of significant magnitude must be supplied to a GTO's control gate to implement turn-off thereof. Since the energy requirement for the GTO control gate during turn-off is proportional to the turn-off current required thereby, this energy requirement is significant, or high.

A further deficiency or a GTO arises in a practical implementation thereof wherein the GTO has its control gate and cathode interdigitated to optimize its turn-off gain (that is, the ratio of turn-off control gate current to the device current). The deficiency is that the device area underneath the control gate does not substantially contribute to carrying device current. Consequently, such a GTO fails to utilize a high percentage of its semiconductor body for carrying current through the device.

Another deficiency of a GTO is that its speed of turn-off is limited by carrier recombination in the inner region of the device which is not connected to its control gate, after the p-n junction between the two inner regions of the device becomes reverse biased.

OBJECTS OF THE INVENTION

Accordingly, it is an object of the present invention to provide a four-region semiconductor device including at least one further region and having a turn-off capability, which device has a low energy requirement for its turn-off control gate and which device, further, utilizes a high percentage of its semiconductor body for carrying current through the device.

Another object is to provide a four-region semiconductor device including at least one further region and having a turn-off capability, which device is not subject to the entire delay of carrier recombination in either of its inner regions during turn-off, thereby achieving high-speed turn-off.

SUMMARY OF THE INVENTION

In carrying out the objects of the invention, there is provided a semiconductor device comprising a body of semiconductor material, a first electrode, a second electrode, and a third electrode spaced from the body by a first insulative layer. The body comprises first, second, third, and fourth regions, successively joined together in the foregoing order. The first region is separated from the third and fourth regions by the second region, and the fourth region is separated from the first and second regions by the third region. The first and third regions are of one conductivity type, and the second and fourth regions are of the opposite conductivity type. The semiconductor body further comprises a fifth region adjoining the fourth region, separated from the first, second, and third regions by the fourth region, and which is of the one conductivity type. The first electrode is electrically connected to the first region. The second electrode is electrically connected to the fourth and fifth regions. The third electrode overlies an area of the fourth region, but is spaced therefrom by the first insulative layer. The third electrode, the first insulative layer, and the fourth region are so constructed and arranged that a first inversion channel within the fourth region, and connecting together the third and fifth regions is induced beneath the third electrode upon application to the third electrode of a first bias voltage having predetermined polarity and magnitude.

The semiconductor device may conveniently be referred to as a metal-oxide-semiconductor turn-off thyristor ("MOSTOT"). The term "metal" in "metal-oxide-semiconductor" connotes, as is known in the art, metal or other highly conductive material, such as highly doped polysilicon and the term "oxide" connotes an oxide of semiconductor material or another insulating layer.

BRIEF DESCRIPTION OF THE DRAWING FIGURES

The features of the invention believed to be novel are set forth with particularity in the appended claims. The invention itself, however, both as to organization and method of operation, together with further objects and advantages thereof, may best be understood by reference to the following description taken in conjunction with the accompanying drawing figures in which:

FIG. 4 is a schematic, cross-sectional view of a portion of a MOSTOT incorporating a further embodiment of the present invention;

FIG. 5 is an electrical circuit representation of a portion of the MOSTOT shown in FIG. 4;

FIG. 8 is a schematic, cross-sectional view of a portion of a MOSTOT incorporating a modification of the embodiment shown in FIG. 6; and FIG. 9 is a schematic, cross-sectional view, in perspective, illustrating various aspects of a preferred implementation of the present invention.

DETAILED DESCRIPTION OF THE INVENTION

Figure 1:
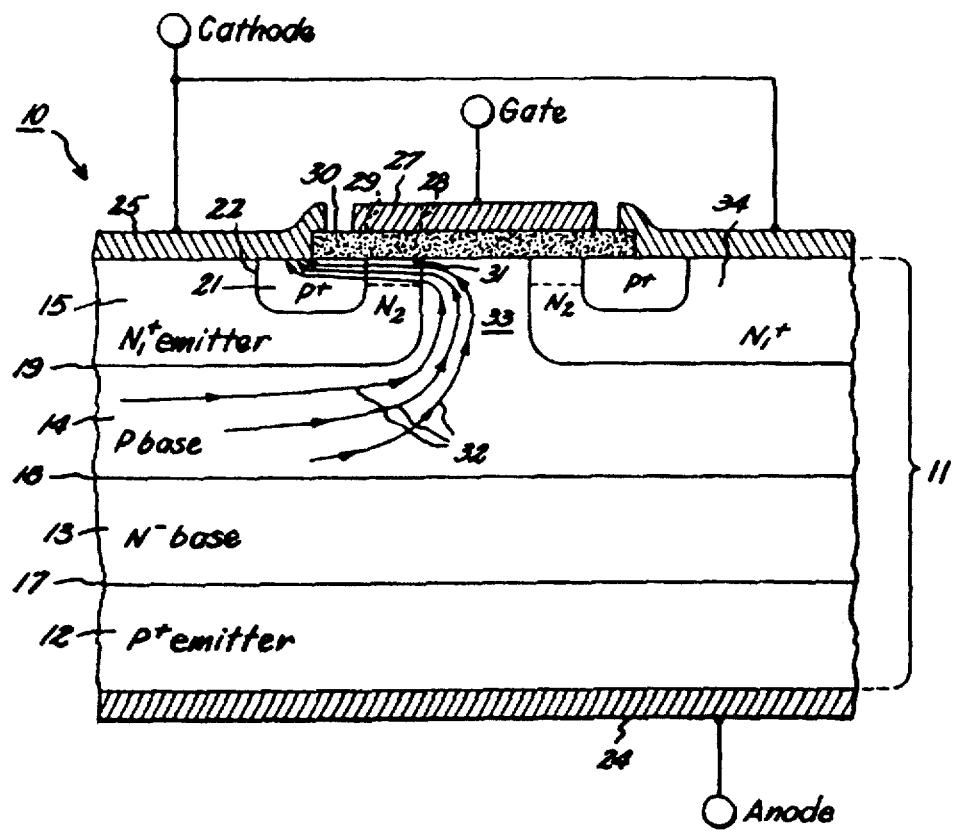
FIG. 1 is a schematic, cross-sectional view of a portion of a MOSTOT incorporating one embodiment of the present invention.

FIG. 1 shows a portion of a MOSTOT 10. The left-hand side of the device 10, as shown, comprises half of a ell the other side of which is preferably symmetrical with the shown half, and the right-hand side of the MOSTOT 10, as shown, comprises a portion of a further cell which advantageously is configured substantially the same as the former cell. Accordingly, only the left-hand cell is described in detail here.

The MOSTOT 10 includes a semiconductor body 11, which comprises first, second, third and fourth regions, 12, 13, 14 and 15, respectively, successively joined together in the foregoing order. The first region 12 is separated from the third and fourth regions 14 and 15 by the second region 13; and the fourth region 15 is separated from the first and second regions 12 and 13 by the third region 14. The junction between the first and second regions 12 and 13 defines a first junction 17; the junction between the second and third regions 13 and 14 defines a second junction 18; and the junction between the third and fourth regions 14 and 15 defines a third junction 19. The first and third regions 12 and 14 are both of one conductivity type, P-type here; and the second and fourth regions 13 and 15 are both of the opposite conductivity type, N-type here. In the particular MOSTOT shown, the regions 12–15 comprise, respectively, a $P^+$ emitter region, an $N^-$ base region, a P base region, and an $N^+$ emitter region (having portions $N_1^+$ and $N_2$, as discussed below). The first region 12 preferably has a maximum doping concentration in excess of about $10^{18}$ impurity atoms per cubic centimeter; the second region 13 preferably has a maximum doping concentration below about $10^{16}$ impurity atoms per cubic centimeter; the third region 14 preferably has a maximum doping concentration below about $10^{17}$ impurity atoms per cubic centimeter; and the $N_1^+$ portion of the fourth region 15 preferably has a maximum doping concentration in excess of about $10^{18}$ impurity atoms per cubic centimeter. It is desirable that the foregoing doping concentrations be selected to provide good thyristor action in the MOSTOT 10, and, accordingly, specific quantitative values of such doping concentrations will be apparent to those skilled in the art.

The semiconductor body 11 further comprises a fifth region 21 which adjoins the fourth region 15 and is separated from the first through third regions 12–14 by the fourth region 15. The fifth region 21 is of the one conductivity type, P-type here, and preferably has a doping concentration in excess of about $10^{18}$ impurity atoms per cubic centimeter to attain good electrical contact to an electrode 25, discussed below. The junction between the fourth and fifth regions 15 and 21 defines a fourth junction 22. The third and fourth junctions 19 and 22 each have respective terminated portions at the exterior of the semiconductor body 11, such terminated portions being at the upper surface of the body 11 in the particular embodiment shown.

A first electrode 24 is electrically connected to the first region 12, and functions as an anode in the MOSTOT 10. A second electrode 25 is electrically connected to both the fourth and fifth regions 15 and 21, and functions as a cathode in the device 10. A third electrode 27 is spaced from the body 11 by an insulative layer 30. The third electrode 27 functions as a turn-off control gate in the MOSTOT 10. The third electrode 27 "overlies" an area of the semiconductor body 11 extending at a minimum from a location proximate the aforesaid terminated portion of the third junction 19, such as at dashed line 28, to a location proximate the aforesaid terminated portion of the fourth junction 22, such as at dashed line 29. While the third electrode 27 preferably overlaps the exposed portions of the third and fourth unctions 19 and 22, as shown, a small amount of underlap is tolerable. What is crucial is that, in accordance with the invention, the third electrode 17, the insulative layer 30, and the fourth region 15 are so constructed and arranged that an inversion channel 31, as delineated by a dashed line within the fourth region 15 and which connects together the third and fifth regions 14 and 21, is formed beneath the third electrode 27 by applying a bias voltage thereto which has a polarity and a magnitude suitable to attract minority carriers of the fourth region 15 into the channel 31. The overlapping of the third electrode 27 over the exposed portions of the third and fourth junctions 19 and 22 serves to enhance such attraction of minority carriers of the fourth region 15 into the channel 31, and helps to ensure a path of low resistance to "bypass" carriers, or carriers having a same electrical sign as such minority carriers. The electrical resistance to such bypass carriers (holes, here) of the channel 31 (hereinafter, simply "resistance") varies according to the magnitude of the aforesaid bias voltage in a manner which will be apparent to those skilled in the art.

To implement the instant embodiment of the invention, with the inversion channel 31 present due to the application to the third electrode 27 of the aforesaid bias voltage, the maximum electrical resistance presented to bypass carriers along a distributed, bypass carrier current path 32, extending from the interior of the third region 14, through the channel 31, and through the fifth region 21, to the second electrode 25, constitutes a value selected to limit forward biasing of the third junction 19 as a result of bypass carrier current flow in the current path 32 to no more than about one-half of the energy bandgap voltage of the semiconductor material forming the third junction 19 (hereinafter, simply "energy bandgap voltage"). This enables the MOSTOT 10 to turn off, as will be more apparent from the discussion of device turn-off below.

The distributed bypass carrier current path 32, which exists during device turn-off is to be distinguished from the hole and electron current paths which exist in the device in the on-state. Such on-state current paths are generally oriented straight up and down across the various junctions 17, 18, and 19, as viewed in FIG. 1.

To facilitate the attainment of the proper value for the resistance of the distributed, bypass carrier current path 32, the fourth region 15 preferably has an $N_2$ portion, as shown in FIG. 1, in which the first channel 31 is situated and which has a maximum doping concentration below about $10^{17}$ impurity atoms per cubic centimeter in the area occupied by the channel 31. This facilitates the creation of the inversion channel 31 upon the application to the third electrode 27 of the aforesaid bias voltage. Such doping of the $N_2$ portion in the fourth region 15 can be achieved by, first, providing an $N^+$ diffusion for the entire fourth region 15 through a first diffusion window, and, second, providing a carefully selected $P^+$ lateral diffusion for the fifth region 21 through a second diffusion window located within the first diffusion window, thereby forming the $N_2$ portion having a lower doping concentration than the original $N^+$ diffusion.

Alternatively, the fourth region 15 can be formed by one diffusion for the $N_1^+$ portion, and another diffusion for the $N_2$ portion, which overlaps the diffusion for the $N_1^+$ portion after which the $P^+$ fifth region 21 can be diffused into the fourth region 15 through a diffusion window located within the same diffusion window used for diffusing the $N_2$ portion.

Additionally, to facilitate the attainment of the proper value for the resistance of the distributed, bypass carrier current path 32, the following design considerations should be taken into account. Reducing the overall length of the current path 32 by reducing the horizontal dimension of the fourth region 15 as viewed in FIG. 1 will desirably decrease the resistance of the current path 32. Further, the length of the channel 31 (that is, the dimension in the direction of current flow) can be minimized, and the width of the channel 31 (that is, the dimension normal to the direction of current flow) can be maximized, both of which desirably decrease the resistance of the current path 32. In connection with maximizing the width of the channel 31, the configuration of the fourth region 15 of the MOSTOT 10 as viewed from above (which defines the cell configuration) preferably is square or round, as opposed to being elongated, whereby the channel width per area of each cell is maximized. Still further, the doping of the third and fifth regions 14 and 21 to high concentrations desirably decreases the resistance of the current path 32; however, the third region 14 should not be too highly doped lest the forward drop of the MOSTOT 10 becomes undesirably excessive.

In general, the lower the resistance of the bypass carrier current path 32, the greater the amount of device current that can be turn off. In a worst case analysis, the MOSTOT 10 could turn off a maximum amount of current equalling one-half of the energy bandgap voltage divided by the resistance of the current path 32. Such a worst case analysis assumes the following (1) that all hole current passing upward in the MOSTOT 10 through the second junction 18 as viewed in FIG. 1 is constrained to flow in the distributed current path 32; (2) that the total device current passing across the second junction 18 consists solely of hole current; and (3) that the maximum voltage across the third junction 19 must be reduced all the way to one-half of the energy bandgap voltage before device turn-off can occur. A computed example of a one-dimensional model of a particular implementation of the MOSTOT 10 of FIG. 1 indicates, however, that the MOSTOT 10 can turn off considerably more current than in the foregoing, worst case.

Figure 2:
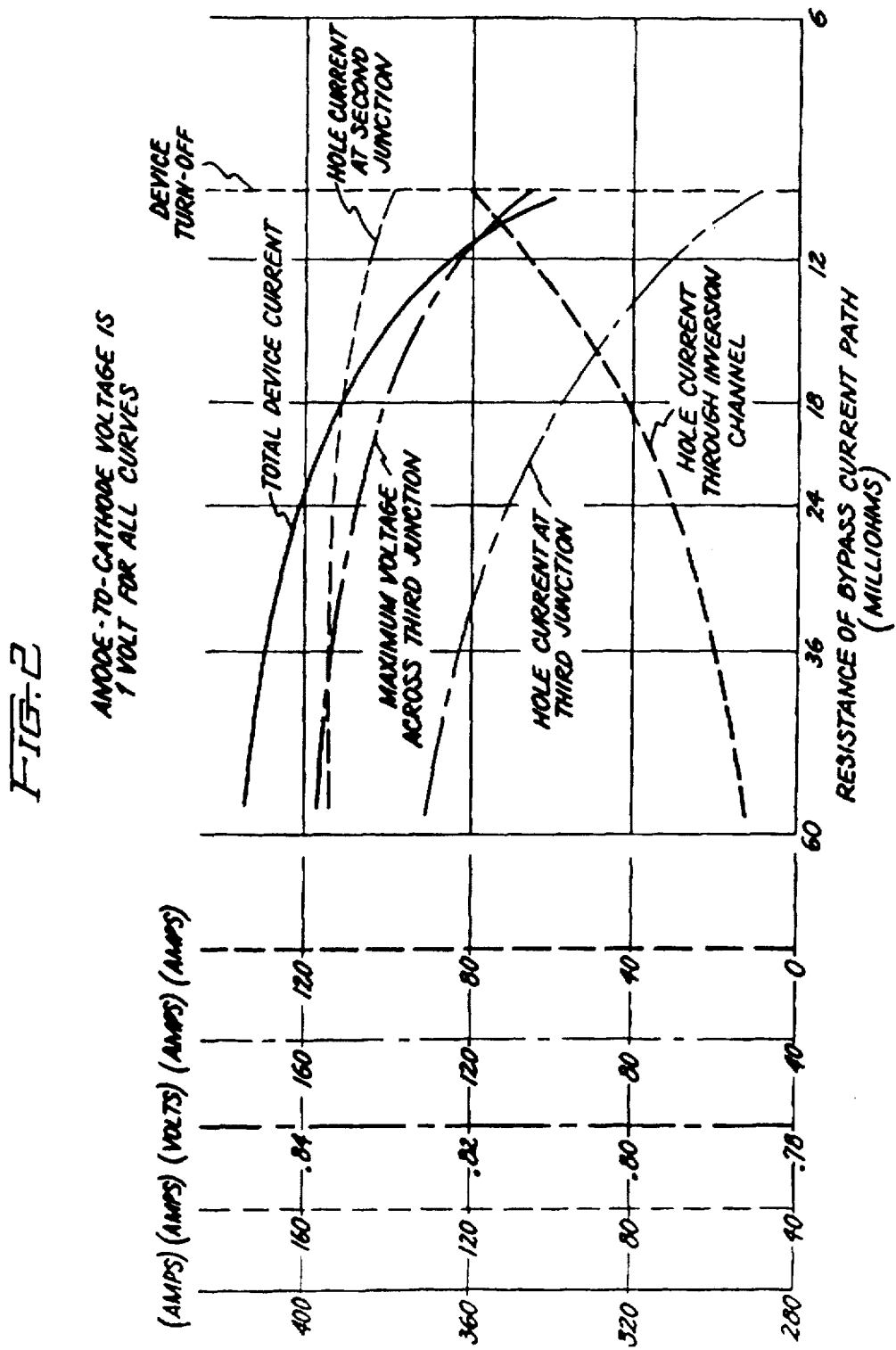
FIG. 2 is a composite graph of various parameters of the MOSTOT of FIG. 1 versus the resistance of a bypass current path of such device.

Such computed example has provided the data illustrated in the composite graph of FIG. 2, wherein various device parameters are plotted against the resistance of the bypass carrier current path 32. When such resistance has been reduced to about 10 milliohms, the MOSTOT 10 turns off, and all the curves shown fall to zero. As can be appreciated from FIG. 2, the hole current through the current path 32 ("Hole Current through Inversion Channel") comprises but a fraction of the hole current at the second junction 18. Additionally, it can be seen that the hole current in the current path 32 comprises only about 40 per cent of the total device current. Further, it can be seen that the maximum voltage across the third junction 19 only needs to be reduced to about 0.814 volts in order for turn-off of the MOSTOT 10 to occur, as compared with one-half of the energy bandgap voltage, which is about 0.6 volts for silicon.

It is believed that the foregoing computed example represents more typical design assumptions than does the worst case, discussed above. Accordingly, a typical MOSTOT 10 of FIG. 1 can turn off considerably more current than the worst case analysis suggests.

Figure 3:
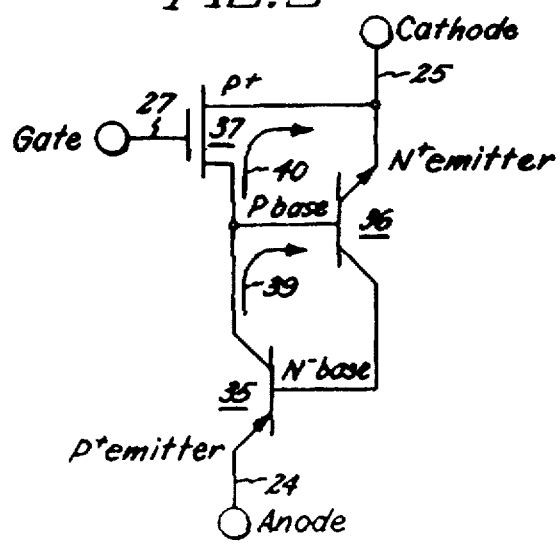
FIG. 3 is an electrical circuit representation of a portion of the MOSTOT shown in FIG. 1.

The operation of the MOSTOT 10 can be understood with reference to FIG. 3, which shows an electrical circuit representation of one of the cells of the MOSTOT 10 of FIG. 1. In FIG. 3, the electrodes 24, 25 and 27 correspond to the like numbered electrodes in FIG. 1. The first, second, and third regions 12, 13, and 14 of FIG. 1 are represented in FIG. 3 by a bipolar 35, while the second, third and fourth regions 13, 14 and 15 are represented by a bipolar transistor 36. The transistors 35 and 36 are coupled to each other in back-to-back fashion. The inversion channel 31 of FIG. 1, along with the $P^+$ fifth region 21 at one end thereof and with the P base third region 14 at the other end thereof, is represented as a metal-oxide semiconductor field effect transistor ("MOSFET") 37 in FIG. 3. When the MOSTOT 10 10 is in a turned on condition, device current flows from the anode electrode 24 to the cathode electrode 25 and the transistors 35 and 36 operate in a regenerative mode; that is, the collector current for one transistor drives the base of the other transistor, and vice-versa, thereby maintaining the MOSTOT 10 turned on. The hole current path from the collector of the transistor 35 to the base of the transistor 36 is indicated by the current arrow 39. Upon application of the aforesaid bias voltage (which is negative, here) to the gate electrode 27, the MOSFET 37 draws away or "steals" hole current from the hole current path 39, and directs the diverted current through the path indicated by the current arrow 40 (this is the analog of the bypass current path 32 of FIG. 1), to the cathode electrode 25. When the bias voltage on the gate electrode 27 reaches a sufficient magnitude, the resistance through the MOSFET 37 will be sufficiently lowered to a value that reduces the base-to-emitter voltage of the transistor 36 below about one-half of the energy bandgap voltage of the semiconductor material forming is base-to-emitter junction. This causes the transistor 36 to turn off, which, in turn, causes the transistor 35 to turn off, thereby turning off the cell of the MOSTOT 10 of FIG. 1, which is represented in FIG. 3. For the entire MOSTOT 10 to turn off, however, it is necessary that all the cells in the MOSTOT 10 turn-off.

In order to achieve turn-off of the MOSTOT 10, the third electrode, or turn-off control gate 27, needs to be biased with a bias voltage and charged to a value proportional to the capacitance between the third electrode 27 and the semiconductor body 11. Because the energy requirement for the turn-off control gate 27 is proportional to the product of the square of such bias voltage and the value of such capacitance, and because the values of both of such voltage and capacitance are low (for example, 10 volts and 1000 picofarads-cm$^2$, respectively), it can be appreciated that the energy requirement of the turn-off control gate 27 is likewise low.

When the MOSTOT 10 is operating in a turned on condition, the region 33 between the vertical walls of the adjacent $N^+$ emitter regions 15 and 34 is a region of reduced electron injection from the $N^+$ emitter regions 15 and 34; accordingly, current flow from the anode to the cathode of the MOSTOT 10 is reduced in the region 33 compared with the remainder of the illustrated portion of the semiconductor body 11. However, because the region 33 is typically much smaller than the remainder of the semiconductor body 11, and because current spreading of electrons occurs as they flow downward to the anode 24, the MOSTOT 10 achieves utilization of a high percentage of the semiconductor body 11 for carrying current therethrough. The deleterious effect of the region 33 becomes reduced as the dimension between the anode 24 and the cathode 25 becomes larger.

Turning now to FIG. 4, a portion of a MOSTOT 45 incorporating a second embodiment of the invention is shown, and comprises two half cells in the same manner as the device 10 of FIG. 1. The MOSTOT 45 has first through fourth regions 47, 48, 49 and 50, respectively, which are suitably doped to the same concentrations as the first through fourth regions 12, 13, 14 and 15, respectively, of the MOSTOT 10 of FIG. 1. The anode and cathode electrodes 52 and 53 of the device 45 correspond to the anode and cathode electrodes 24 and 25 of the MOSTOT 10. In the MOSTOT 45, carriers, electrons here, are diverted to the anode electrode 52 through a distributed, bypass carrier current path 55, which is the complement of the bypass carrier current path 32 of the MOSTOT 10. The current path 55 includes an inversion channel 57 within the first region 47, which is the complement of the inversion channel 31 of the MOSTOT 10. The inversion channel 57 is created by application of a bias voltage, positive here, to a turn-off control gate 58 which is separated from the semiconductor body 59 by an insulative layer 60. The bypass carrier current path 55 further includes a fifth region 61, which is the complement of the fifth region 21 of the MOSTOT 10. The gate electrode 58 and insulative layer 60 correspond to the gate electrode 27 and insulative layer 30 of the device 10. Additionally, the first region 47 preferably has a $P_1^+$ portion and a $P_2$ portion, preferably having a lower doping concentration than the $P_1^+$ portion, corresponding to the preferred relative doping concentrations of the $N_1^+$ and $N_2$ portions, respectively, of the fourth region 15 of the MOSTOT 10 discussed above. Accordingly, an understanding of the MOSTOT 45 will be apparent to those skilled in the art, based upon the above description of the MOSTOT 10, along with the foregoing comments noting complementarities and correspondences between the MOSTOT 10 and 45.

A further understanding of the MOSTOT 45 can be had for considering its operation with reference to FIG. 5, which shows an electrical circuit representation of one of the cells of the MOSTOT 45 of FIG. 4. In FIG. 5, the electrodes 52, 53, 58 correspond to the like numbered electrodes in FIG. 4. The first through fourth regions 47–50 are represented in FIG. 5 by coupled, back-to-back bipolar transistors 62 and 64, in the same manner as the transistors 34 and 35 of FIG. 3 represent the first through fourth regions 12–15 of the MOSTOT 10. The inversion channel 57 of FIG. 4, along with the $N^+$ fifth region 61 at one end thereof and with the $N^-$ base region 48 at the other end thereof, is represented as a MOSFET 65 in FIG. 5. When the MOSTOT 45 is in a turned-on condition, the device current flows from the anode electrode 52 to the cathode electrode 53, and the transistors 62 and 65 operate in a regenerative mode; that is, the collector current of one transistor drives the base of the other transistor, and vice-versa, thereby maintaining the MOSTOT 45 turned on. The electron current path from the collector of the transistor 64 to the base of the transistor 62 is indicated by current arrow 67. Upon application of the aforesaid bias voltage (which is positive, here) to the gate electrode 58, the MOSFET 65 draws away or "steals" electron current from the current path 67 and directs the diverted electron current through the path indicated by current arrow 68, to the anode electrode 52. When the bias voltage on the gate 58 reaches a sufficient magnitude, the resistance of the MOSFET 65 will be sufficiently reduced to such a value that the base-to-emitter voltage of the transistor 62 is reduced to below about one-half of the energy bandgap voltage thereof. This causes the transistor 62 to turn-off, which in turn, causes the transistor 64 to turn-off, thereby turning off the cell of the MOSTOT 45 of FIG. 4 which is represented by the circuit of FIG. 5. For the entire MOSTOT 45 to turn-off, however, it is necessary that all the cells in the MOSTOT 45 turn off.

As is the case with the embodiment shown in FIG. 1, the embodiment of FIG. 4 attains the objects of a low energy requirement for the turn-off gate control electrode 58, and of utilization of a high percentage of the semiconductor body 59 thereof for carrying current.

Figure 6:
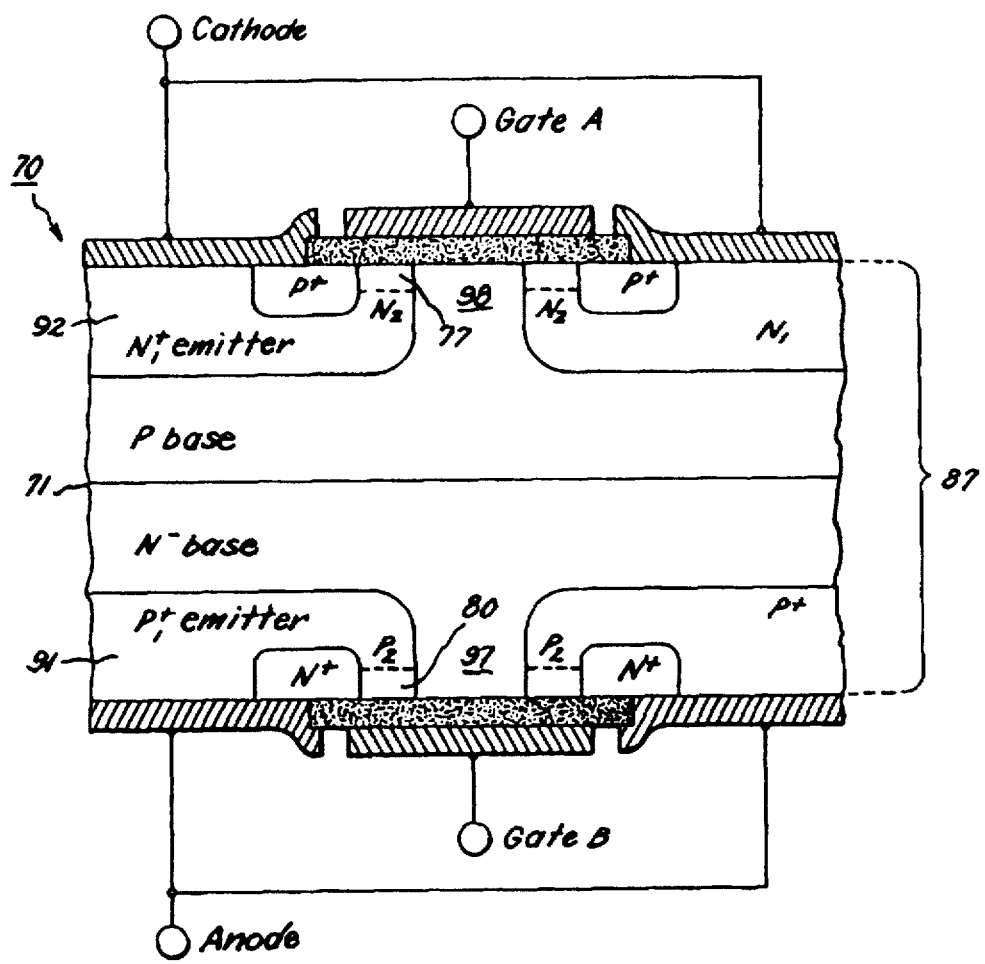
FIG. 6 is a schematic, cross-sectional view of a portion of a MOSTOT incorporating a still further embodiment of the present invention.

Turning to FIG. 6, a portion of a MOSTOT 70 incorporating a third embodiment of the present invention is shown, and comprises two half cells in the same manner as the MOSTOT 10 of FIG. 1. The MOSTOT 70 incorporates features of both the MOSTOT 10 of FIG. 1 and the MOSTOT 45 of FIG. 4. Specifically, the portion of the MOSTOT 70 above second junction 71 suitably is substantially identical to the portion of the MOSTOT 10 above the second junction 18 thereof; and the portion of the MOSTOT 70 below the second junction 71 suitably is substantially identical to the portion of the MOSTOT 45 below second junction 72 thereof. Accordingly, an understanding of the MOSTOT 70 can be had by consideration of the above discussions of the MOSTOTs 10 and 45 in light of the foregoing comments.

The portion of the MOSTOT 70 shown thus has two turn-off control gates, gate A and gate B, which provides faster device turn-off, as will become apparent from the discussion below.

Figure 7:
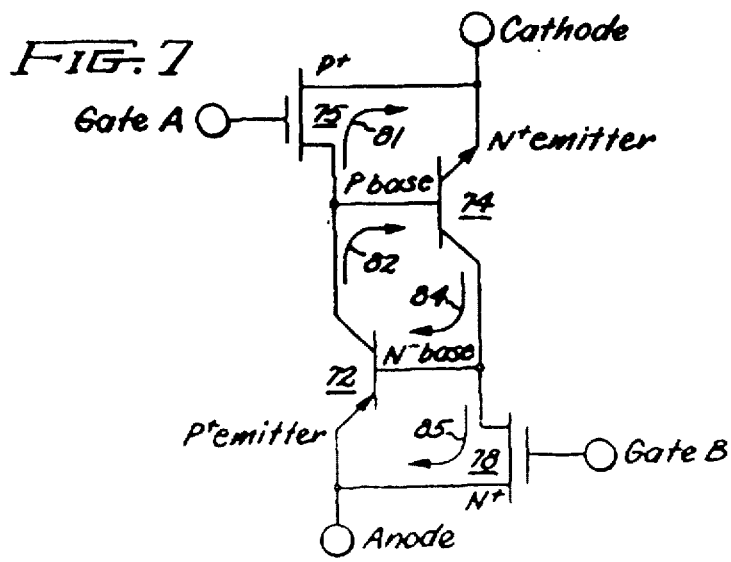
FIG. 7 is an electrical circuit representation of a portion of the MOSTOT shown in FIG. 6.

A further understanding of the MOSTOT 70, including details of operation, can be had by reference to FIG. 7, which shows an electrical representation of one of the cells of the MOSTOT 70 shown of FIG. 6. In FIG. 7, the gate A, gate B, anode and cathode electrodes correspond to the like designated electrodes of FIG. 6. The four regions of the MOSTOT 75 of FIG. 6, designated $P_1^+$ emitter, $N^-$ base, P base, and $N_1^+$ emitter, are represented in FIG. 7 by bipolar transistors 72 and 74, in the same manner as the transistor 34 and 35 of FIG. 3 represent the first through fourth regions 12–15 of the MOSTOT 10. An upper MOSFET 75 is associated with the upper inversion channel 77 of FIG. 6, and a lower MOSFET 78 is associated with the lower inversion channel 80 of FIG. 6. From the previous descriptions of the MOSTOTs 10 and 45, it can be appreciated that a negative bias voltage having a sufficient magnitude applied to gate A will divert sufficient hole current 81 away from the P base hole current 82 so as to reduce the base-to-emitter voltage of the transistor 80 below about one-half of the energy bandgap voltage thereof, thereby inducing turn-off of the transistor 74. This, in turn, causes the transistor 72 to turn off; however, the turn-off of this transistor 72 is slowed by carrier recombination in the $N^-$ base region of the MOSTOT 70 after the second junction 71 becomes reverse biased during the process of device turn-off. In accordance with the instant embodiment of the present invention, the delay due to carrier recombination in the $N^-$ base region of the MOSTOT 70 is largely avoided by diverting sufficient electron current 85 away from the $N^-$ base electron current 84 and channeling the diverted electron current 85 to the anode electrode through the MOSFET 78, thereby turning off the transistor 72. The MOSFET 78 is activated to accomplish this result through application to the gate B of a bias voltage, positive here, of sufficient magnitude so as to reduce the base-to-emitter voltage of the transistor 72 below about one-half of the energy bandgap voltage thereof. Accordingly, the instant embodiment of the invention attains the object of high-speed turn-off by not being subject to the entire delay of carrier recombination in its inner region, the $N^-$ base region here, after the second junction 71, or p-n junction between the two inner regions, P base and $N^-$ base, of the MOSTOT 70, becomes reverse biased.

In practising the foregoing described third embodiment of the invention, illustrated by way of example in FIG. 6, the density of cells (which determines cell size or, alternatively, the number of cells when, for instance, some cells are deleted) of the MOSTOT 70 above the second junction 71 need not be the same as the density of cells below this junction. Further, in order to achieve the fastest device turn-off, the aggregate hole current passing through all the inversion channels under gate A, such as the inversion channel 77, should be approximately equal to the aggregate electron current passing through all the inversion channels under gate B, such as the inversion channel 80, whereby the lower and upper bipolar transistor portions of the MOSTOT 70, represented by transistors 72 and 74 in FIG. 7, respectively, turn off at approximately the same rate. This may require different cell densities above and below the second junction 71 in the MOSTOT 70, and, for example, where the semiconductor body 87 of the MOSTOT 70 comprises silicon, the cell density above the second junction 71 should be greater than the cell density below this junction. This is because in silicon the resistance to hole current is greater than the resistance to electron current; thus, the cell density above the second junction 71, pertaining to bypass carrier current consisting of holes (not illustrated), should be relatively high, thereby shortening the path of such bypass carrier current (not illustrated) and limiting the resistance of such path to a desired value.

The MOSTOT 70 additionally attains the objects of the previous MOSTOTs 10 and 45, namely, the objects of a low energy requirement for its turn-off control gates, (both gate A and gate B), and of the utilization of a high percentage of its semiconductor body 87 for carrying current.

Turning to FIG. 8, a portion of a MOSTOT 90 illustrating a modification of the MOSTOT 70 of FIG. 6 is shown. The difference between the MOSTOTs 70 and 90 is that in the MOSTOT 70, first and fourth regions 91 and 92, respectively, are horizontally aligned with each other as viewed in FIG. 6, whereas in the device 90, first and fourth regions 94 and 95, respectively, are horizontally offset from each other as viewed in FIG. 8. The MOSTOT 70 of FIG. 6 has the advantage of maximizing current-carrying capacity. This is because the areas of reduced carrier injection 97 and 98, adjacent to the first and fourth regions 91 and 92, (and thus, adjacent to the upper and lower inversion channels 77 and 80) are horizontally aligned with each other, thereby minimizing the influence of these regions in decreasing the current carrying capacity of the MOSTOT 70. On the other hand, the MOSTOT 90 of FIG. 8 maximizes turn-off speed. This is because the upper inversion channels, such as channel 100, which are horizontally offset from the lower inversion channels, such as channel 101, are provided with a large flow of hole current originating from the first layer 94; and the lower inversion channels, such as channel 101, are provided with a large flow of electron current originating from the fourth layer 95. With the foregoing inversion channels receiving large hole and electron currents, respectively, the lower and upper transistor portions of the MOSTOT 90, represented by the transistors 72 and 74 in FIG. 7, respectively, are forced to turn off especially rapidly. The thicker the MOSTOTs 70 and 90 are, however, the less pronounced are the foregoing differences between them.

In making the MOSTOTs described herein, the first through third regions, as these terms are used above, are preferably fabricated using conventional techniques for making thyristors. This is due to the fact that the first and second junctions, as these terms are used above, comprise the main voltage blocking junctions of the respective MOSTOTs, at least where the first through fourth regions are doped to the various concentrations described herein, and also because thyristor technology comprehends the effectiveness of these junctions for voltage blocking purposes. Further, unlike the situation in MOS technology, carrier lifetime should be long, especially in the second region, so as to provide low forward voltage as is known in the art. The turn-off gates and their associated insulative layers, as well as the fifth region, as these terms are used above, are suitably fabricated using conventional techniques for making field-effect transistors ("FET's"). The fourth region, as this term is used above, is suitably fabricated using either thyristor or FET technology.

Various aspects of a preferred implementation of the invention are illustrated in FIG. 9, showing a portion of a MOSTOT 110. The semiconductor body of the MOSTOT 110 comprises a silicon wafer, with first through fourth regions 112–115, respectively, each comprising a layer substantially aligned with a major surface of the wafer. An area 117 of the MOSTOT 110 corresponds to the right-hand side of the MOSTOT 10 as shown in FIG. 1. The shape of a cell in the MOSTOT 110 is square, and each cell is so constructed and arranged that approximately the same amount of device current is turned off by each. Turn-off gate electrode 118 comprises polysilicon, either P-type or N-type, which is doped to a very high concentration to increase its conductivity and to enable all cells with which the electrode 118 is associated to turn off at approximately the same time. The gate electrode 118 has a substantially rectangular cross-section, and an insulative layer 120 forms a sleeve around the bottom, top, and sides thereof. The insulative layer 120 comprises an oxide of the semiconductor body of the MOSTOT 110, deposited nitride, or a combination thereof. Cathode electrode 121 is disposed over the entire upper surface of the portion of the 110 shown, and is insulated from the gate electrode 118 by the insulative layer 120.

In area 122 of the MOSTOT 110, a cathode-emitter short is illustrated. The cathode electrode 121 is disposed over the semiconductor body in the area 122, the gate electrode 118 advantageously not being present in this area because it does not interact with the semiconductor body in this area. The cathode electrode 121 is connected to, and, thus, electrically shorts together portions of the $N^+$ emitter region 115 and the P base region 114, thereby reducing the sensitivity of the MOSTOT 110 to spurious turn-on due to noise or thermal currents in its semiconductor body. The $P^+$ regions within the area 122, unlike the $P^+$ region within the fourth layer 123 of the area 117, do not perform any electrical function, but may conveniently be disposed there to simplify device manufacture. Cathode-emitter shorts preferably are occasionally but regularly interspersed amongst the cells in the MOSTOT 110 incorporating elements of the present invention, such as the cell in the area 117. This obviates the need for maintaining a bias voltage on the turn-off control gate 118 to keep the MOSTOT 110 in a turned-off condition. Alternatively, or in addition to the foregoing use of cathode-emitter shorts, anode-emitter shorts, such as the electrical short implemented in area 124 by anode electrode 125 connecting together the $P^+$ emitter region 112 and $N^-$ base region 112, preferably are occasionally but regularly interspersed amongst the cells in the MOSTOT 110 incorporating elements of the present invention, such as the cell in the area 117. Anode-emitter shorts, similar to cathode-emitter shorts, reduce the sensitivity of the MOSTOT 110 to spurios turn-on due to noise or thermal currents in its semiconductor body. Anode-emitter shorts also serve to speed up MOSTOT 110 with an anode-emitter short is what is known in the art as an asymmetric device, because it cannot block reverse voltage. Anode-emitter shorts per se, as well as cathode-emitter shorts per se, are known in the art.

While no specific gate means for turning on the various MOSTOTs described herein have been illustrated, it will be apparent to those skilled in the art that these MOSTOTs may suitably be turned on by any conventional gate means, such as by a turn-on gate electrode connected to either the second or third regions, as these terms are used above, for turning on any of the MOSTOTs described herein. Additionally, these MOSTOTs can be turned on with an MOS turn-on gate, such as described in D. Kahng, editor, *Silicon Integrated Circuits—Part B*, Academic Press, 1981, at pages 265–267. A further suitable technique of turning on the MOSTOTs comprises optical light turn-on. Moreover, the invention renders practical turn-on of the MOSTOTs by noise or thermal current (or a combination thereof) in their semiconductor bodies, which heretofore has been characterized, for example, as "Non-Gated Undesirable Thyristor Triggering", the title of Chapter 6 of A. Blicher, *Thyristor Physics*, Springler-Verlag (1976). Such turn-on requires that a MOSTOT not include cathode-emitter or anode-emitter shorts, such as described above, whereby the sensitivity of the MOSTOT to turn-on by noise or thermal current (or a combination thereof) is rendered high, and the MOSTOT will turn-on in a suitable environment, as will be apparent to those skilled in the art. Turn-off of the MOSTOT can then be enabled through use of the turn-off control gates described herein.

A MOSTOT in accordance with an alternative embodiment of the invention is structurally similar to any of the above-described devices; however, its distributed, bypass carrier current path (or paths) is designed with a resistance to bypass carriers that is too high to permit turn-off of the device solely by means of biasing the gate (or gates) of the device. Such device must be commutated off in similar manner as with a conventional thyristor; that is, the polarity of its anode-to-cathode voltage must be reversed so that the device turns off. However, such MOSTOT can turn off much more rapidly than a conventional thyristor. In addition, the design considerations discussed above that are useful in reducing the resistance of a distributed above that are useful in reducing the resistance of a distributed, bypass carrier current path can be relaxed. For example, the device can have a cell size which is larger than in the previously-described MOSTOTs, and, as such, could be fabricated with a higher yield.

While only certain preferred features of the invention have been shown by way of illustration, many modifications and changes will occur to those skilled in the art. For example, each of the second regions of the MOSTOTs described herein, which are shown as N⁻ type, could be modified to have the portion thereof which is in contact with the respective first region doped to a concentration substantially higher than the concentration of the remainder of the second region, whereby the MOSTOT would become what is known in the art as an asymmetric device. As such it can be made thinner and still block the same forward voltage, provided that the resistance of the remainder of the second region is suitably increased. Such thinner devices are notably faster and have lower forward drops than do devices which lack the more highly doped portion in the second region. Since the foregoing asymmetric device cannot block reverse voltage, it preferably also incorporates anode-emitter shorts which similarly make the device asymmetric. Further, while the MOSTOTs described herein have been illustrated as formed by a planar diffusion process, other processes, involving the etching of a groove into a device semiconductor body, can just as well be used. Such a groove can have various shapes, depending upon whether a preferential etch or isentropic etch is used, and upon what the crystallogrphic orientation of the MOSTOT's semiconductor body is. Those skilled in the art will appreciate the range of possible groove shapes. By way of example, a common groove shape is that of a "V", as further described in D. Kahng, editor, *Silicon Integrated Circuits—Part B*, Academic Press, 1981, at pages 209–210. The invention does not depend upon the various regions of the described MOSTOTs having any particular configurations; therefore, other configurations of these regions can be utilized whereby, for example, a planar MOSTOT can be made having all of its p-n junctions terminating at a common MOSTOT surface which is planar. Further, referring to FIG. 1, by way of example, the invention does not require the fourth region 15 to have any particular shape; therefore, the first region 15 could be elongated, or round, by way of example. Likewise, referring to FIG. 4, by way of example, the present invention does not require the first region 47 to have any particular shape; therefore, it could be elongated or round, by way of example. Still further, the invention applies to complementary devices, wherein P-type regions are used in place of the N-type regions described herein, and vice-versa. It is, therefore, to be understood that the appended claims are intended to cover all such modifications and changes as fall within the true spirit and scope of the invention.

In the various embodiments described herein, the MOSFET transistor, e.g., the transistor 37 shown in FIG. 1, is turned on by applying a gate voltage of suitable polarity to invert the conductivity type of the channel of the transistor. That is, and with reference to FIG. 1, for example, the channel 31 is doped to a conductivity type (N-type in FIG. 1) opposite to that of the regions 21 and 14, and the resistance to current flow between the regions 14 and 21 through the channel 31 is quite high. By inverting the conductivity type of the channel, that is, to P-type in FIG. 1, a quite low resistance current path is created. MOSFET transistors of this type are known as "enhancement" transistors.

Conversely, the MOSFET transistors used in the MOSTOTs can be of the "depletion" type wherein the channel, as fabricated, is of the same conductivity type as the source and drain regions of the MOSFET, whereby a low resistance path inherently exists between the source and drain regions. In such transistors, the application of a gate voltage of a polarity for inverting the conductivity type of the channel causes a large increase in the resistance of the source to drain current path. At zero voltage the path is conductive. For highest conductivity, the gate voltage can be less than zero (for P-type depletion channels) to add a p⁺ parallel surface channel accumulation layer.

The operation of MOSTOTs including depletion MOSFETs is identical to that of MOSTOTs including enhancement type MOSFETs except for the polarities of the gate electrode voltages.

Thus, to maintain a MOSTOT 10 (FIG. 3) having a P-type depletion MOSFET 37 in its on state (anode to cathode current flow), the MOSFET 37 is biased off by applying a positive voltage to the gate electrode 27 for depleting the channel 31 of holes.

For turning off the MOSTOT 10, the MOSFET 37 is turned on by applying a gate voltage suitable for returning the channel 31 to its doped conductivity type, i.e., P-type. This can be done by returning the gate voltage to zero, thus restoring the conductivity of the previously depleted channel. Preferably, a voltage, negative in this example, can be applied to the gate electrode 27 to fully turn on the MOSFET 37 for more rapidly turning off the MOSTOT 10 utilizing the aforementioned $p^+$ accumulation layer.

The design and fabrication of depletion MOSFETs are well known. For example, in the embodiment shown in FIG. 1, and with the previously described dopings of the various regions of the MOSTOT 10, a depletion MOSFET is obtained with a channel 31 of P-type having a maximum doping concentration of about $10^{17}$ to $10^{18}$ impurity atoms per cubic centimeter and a depth of 2000 Å to 200 Å, i.e., a product (the doping of the channel cross-sectional area) of 1 to several times $10^{12}/cm^2$. The upper end of this product is controlled by the desired threshold gate voltage for MOSFET turn-off (channel pinch-off) with higher products requiring higher gate turn off voltages but being more satisfactory for enhancing MOSTOT turn-off capability. As is known to the art, wider ranges of doping concentrations and depth can be used provided the channel can be pinched off within the breakdown field limit of the gate oxide. Further, the MOSTOT can be turned off with a very low channel doping product with the assistance of a parallel surface channel. However, in many applications it is convenient to have a single polarity gate drive where, say, with a 500 Å gate oxide and a 10 volt threshold voltage, the MOSFET could be turned off during MOSTOT turn on by increasing gate voltage to >10V (i.e., 15V) and turned on by reducing gate voltage to zero. As well known to those skilled in this art, a depletion channel MOSFET is typically made by implanting the channel region after regions with deeper junctions have been formed.

What is claimed is:

1. A metal-oxide-semiconductor turn-off thyristor comprising:

a body of semiconductor material comprising first, second, and third regions of semiconductor material wherein said first and third regions are of one type conductivity and said second region is of an opposite type conductivity, a fourth region of said opposite type conductivity disposed within said third region, a fifth region of said one type conductivity disposed within said fourth region and connected to said third region by a channel through said fourth region, a first electrode making electrical contact with said first region, a second electrode making electrical contact with said fourth and fifth regions, and an insulated gate electrode disposed adjacent a portion of said third region and said fourth and fifth regions to control conduction through said channel for coupling one type conductivity carriers from said third region through the channel to said fifth region and thereby control conduction in a bypass current path from said third region through said fourth region into said fifth region;

said thyristor having an ON-state current path extending from said first electrode through said first region, said second region, said third region and said fourth region to said second electrode;

said fourth region having a small enough lateral extent and said third region and said channel having a low enough resistance under appropriate gate bias conditions to divert enough ON-state current into said bypass current path to turn said thyristor off;

said gate electrode being insulated from said portion of said third region.

* * * * *